(12) United States Patent
Hidaka

(10) Patent No.: US 8,949,649 B2
(45) Date of Patent: Feb. 3, 2015

(54) SIGNAL PROCESSING APPARATUS AND SIGNAL PROCESSING METHOD FOR DATA TRANSMISSION

(75) Inventor: Isao Hidaka, Tokyo (JP)

(73) Assignee: Sony Corporation, Tokyo (JP)

(*) Notice: Subject to any disclaimer, the term of this patent is extended or adjusted under 35 U.S.C. 154(b) by 467 days.

(21) Appl. No.: 13/323,951

(22) Filed: Dec. 13, 2011

(65) Prior Publication Data

US 2012/0162233 A1 Jun. 28, 2012

(30) Foreign Application Priority Data

Dec. 22, 2010 (JP) ................. 2010-286316

(51) Int. Cl.
*G06F 1/12* (2006.01)
*G06F 13/42* (2006.01)
*H04L 5/00* (2006.01)
*H04L 25/49* (2006.01)
*H03M 9/00* (2006.01)
*H04L 25/02* (2006.01)

(52) U.S. Cl.
CPC ............. *H04L 25/4904* (2013.01); *H03M 9/00* (2013.01); *H04L 25/0272* (2013.01); *G09G 2370/08* (2013.01)
USPC ....................................................... 713/400

(58) Field of Classification Search
CPC ............................. H04L 25/4904; H03M 9/00
USPC ........................................................... 713/400
See application file for complete search history.

(56) References Cited

U.S. PATENT DOCUMENTS

| | | | |
|---|---|---|---|
| 2004/0109519 A1* | 6/2004 | Mizukami et al. | 375/362 |
| 2005/0111569 A1* | 5/2005 | Mikami et al. | 375/295 |
| 2006/0188012 A1* | 8/2006 | Kondo | 375/240.2 |
| 2008/0180311 A1* | 7/2008 | Mikami et al. | 342/82 |
| 2009/0085896 A1* | 4/2009 | Nagase et al. | 345/204 |
| 2010/0250261 A1* | 9/2010 | Laaksonen et al. | 704/500 |

FOREIGN PATENT DOCUMENTS

JP 2002-165148 * 7/2002 ............... H04N 5/44

* cited by examiner

*Primary Examiner* — Mohammed Rehman
(74) *Attorney, Agent, or Firm* — Sony Corporation

(57) ABSTRACT

Disclosed herein is a signal processing apparatus including: an input block receiving the predetermined number of items of data and a first enable signal taking an active state in an interval where data is valid in synchronization with a first clock; a count block counting the number of clocks in an interval where the first enable signal is inactive; an enable signal control block putting a second enable signal in an active state for the number of clocks equal to a predetermined number and putting the second enable signal in an inactive state for the number of clocks counted by the count block; an enable signal output block outputting the second enable signal; and a data output block outputting the predetermined number of items of data in synchronization with the second clock in an interval where the second enable signal is active.

10 Claims, 9 Drawing Sheets

(EXAMPLE OF SIGNAL TO BE ENTERED IN LCD BLOCK)

SIGNAL PROCESSING APPARATUS AND SIGNAL PROCESSING METHOD FOR DATA TRANSMISSION

BACKGROUND

The present disclosure relates to a signal processing apparatus and a signal processing method.

Portable devices, such as mobile phones and note PCs (Personal Computers), are often made up of main section on which an operator section to be operated by a user is installed and a display section on which a display apparatus, such as an LCD, is installed. A hinge section linking the main section and the display section is realized by a movable member. Normally, this hinge section accommodates a power line and a signal line. Therefore, in accordance with the deformation of the hinge section, the wiring running through the hinge section is subject to deforming deterioration. In order to protect the wiring running through the hinge when the hinge is deformed, a protective section is provided to prevent the wiring from being deteriorated. It should be noted that LCD mentioned above is short for Liquid Crystal Display.

It is important, first of all, for the prevention of the deterioration of the wiring running through the hinge section to decrease the number of wires running through the hinge section. In related-art technologies, the data transmission from the main section to the display section is often realized by parallel transmitting. Application of parallel transmitting requires the wiring of not smaller than several tens of signal lines through the hinge section for transmitting image data to be displayed on the display apparatus. Hence, the deformation of the hinge section causes these signal lines to be twisted, thereby bringing danger of breaking the power line or signal lines. In order to remove this danger, a method was proposed in which serial transmitting is used instead of parallel transmitting for the data transmission through the hinge section.

In the case of serial transmitting, data is encoded before being transmitted. Data is encoded by NRZ (Non Return to Zero) encoding, Manchester encoding, or AMI (Alternate Mark Inversion) encoding, for example. Japanese Patent Laid-Open No. Hei 3-109843 discloses a technology of data transmission by use of AMI encoding that is a typical example of the bipolar encoding techniques, for example. This document also discloses a technology of transmitting a data clock by representing an intermediate value of a signal level and reproducing the data clock on the basis of the signal level on the reception side.

SUMMARY

As described above, the application of serial transmitting increases the degree of freedom of deformation on the hinge section, thereby enhancing designability of portable devices. At the same time, the application of serial transmitting reduces the number of wires to enhance the resistance against twisting, thereby enhancing the reliability of the wiring accommodated in the hinge section. However, in the case of serial transmitting, the amount of data to be transmitted per clock is smaller than that of parallel transmitting, a high-speed clock must be used to achieve the same data transmission rate as that of parallel transmitting. Especially, because the LCD installed on recent portable terminals is high in resolution, a very high-speed clock must be used for the serial transmission of image data to be displayed on the LCD.

The clock for use in serial transmission is generated by multiplying a reference clock on the serializer side. On the other hand, the deserializer side divides the clock for use in serial transmission to generate a clock for use in data output. The clock generated by the serializer side must match the clock used in entering data into the serializer. However, because these clocks are different from each other in the source of generation, an error inevitably slips into both the clocks. As a result, the deserializer side may not correctly reproduce the received data.

Therefore, the present disclosure addresses the above-identified and other problems associated with related-art methods and apparatuses and solves the addressed problems by providing a signal processing apparatus and a signal processing method that are configured to remove, on the basis of a simple circuit configuration, any errors between a clock for use in entering data into the serializer and a clock for use in outputting data from the deserializer.

In carrying out the disclosure and according to one embodiment thereof, there is provided a signal processing apparatus. This signal processing apparatus has an input block configured to receive the predetermined number of items of data and a first enable signal taking an active state in an interval where data is valid in synchronization with a first clock; and a count block configured to count, with a second clock faster than the first clock being reference, the number of clocks in an interval where the first enable signal is inactive. The apparatus further has an enable signal control block configured to put a second enable signal in an active state for the number of clocks equal to a predetermined number with the second clock being reference and put the second enable signal in an inactive state for the number of clocks counted by the count block; an enable signal output block configured to output the second enable signal; and a data output block configured to output the predetermined number of items of data in synchronization with the second clock in an interval where the second enable signal is active.

The above-mentioned signal processing apparatus may have a clock conversion block configured to frequency-convert a reference clock having a predetermined frequency to generate the second clock, wherein the clock conversion block generates the second clock by use of a conversion rule such that the second clock becomes faster than the first clock.

The above-mentioned signal processing apparatus may be made up of a first signal processing module and a second signal processing module connected to the first signal processing module via a predetermined signal line. The first signal processing module has the input block and the count block and a transmission block configured to serialize the data and the number of clocks counted by the count block and transmit the serialized data and the serialized number of clocks to the second signal processing module. The second signal module has a reception block configured to receive the serialized data and the serialized number of clocks from the transmission block of the first signal processing module and make parallel the received serialized data and serialized number of clocks, the enable signal control block, the data output block, and the enable signal output block.

In the above-mentioned signal processing apparatus, instead of transmitting the number of clocks counted by the count block, the transmission block may transmit a difference between the number of clocks of an interval where the first enable signal is inactive with the first clock used as reference and the number of clocks of an interval where the first enable signal is inactive with the second clock used as reference.

In the above-mentioned signal processing apparatus, instead of transmitting the number of clocks counted by the count block, the transmission block may transmit a difference between a predetermined value and the number of clocks of an interval where the first enable signal is inactive with the second clock used as reference.

In the above-mentioned signal processing apparatus, the first signal processing module may further have a serial transmission clock generation block configured to multiply a predetermined reference clock to generate a serial transmission clock for transmitting and receiving the data and the number of clocks and a divider configured to divide the serial transmission clock to generate the second clock. The second signal processing module may further have a divider configured to divide the serial transmission clock to generate the second clock.

In the above-mentioned signal processing apparatus, the count block may count the number of clocks of an interval obtained by combining an interval where the first enable signal is active and an interval following the interval where the first enable signal is inactive, thereby using a value obtained by subtracting the predetermined value from the number of clocks as the number of clocks of the interval where the first enable signal is inactive.

In the above-mentioned signal processing apparatus, the above-mentioned data may be data for display. The above-mentioned signal processing apparatus may further have a computation processing block configured to output data entered in the input block and a display block configured to receive the data outputted from the output block and the second enable signal outputted from sand enable signal output block.

In carrying out the disclosure and according to another embodiment thereof, there is provided a signal processing method. This signal processing method has receiving the predetermined number of items of data and a first enable signal taking an active state in an interval where data is valid in synchronization with a first clock; and counting, with a second clock faster than the first clock being reference, the number of clocks in an interval where the first enable signal is inactive. The method further has putting a second enable signal in an active state for the number of clocks equal to a predetermined number with the second clock being reference and putting the second enable signal in an inactive state for the number of clocks counted in the counting step; outputting the second enable signal; and outputting the predetermined number of items of data in synchronization with the second clock in an interval where the second enable signal is active.

As described above and according to the present disclosure, an error that is caused between a clock for use in inputting data into a sterilizer and a clock for use in outputted data from a deserializer can be absorbed by a simple circuit configuration. As a result, sufficient accuracy can be achieved with a less costly oscillator to hold down the costs of manufacture and design of the apparatus.

DETAILED DESCRIPTION OF THE PREFERRED EMBODIMENTS

Figure 1:
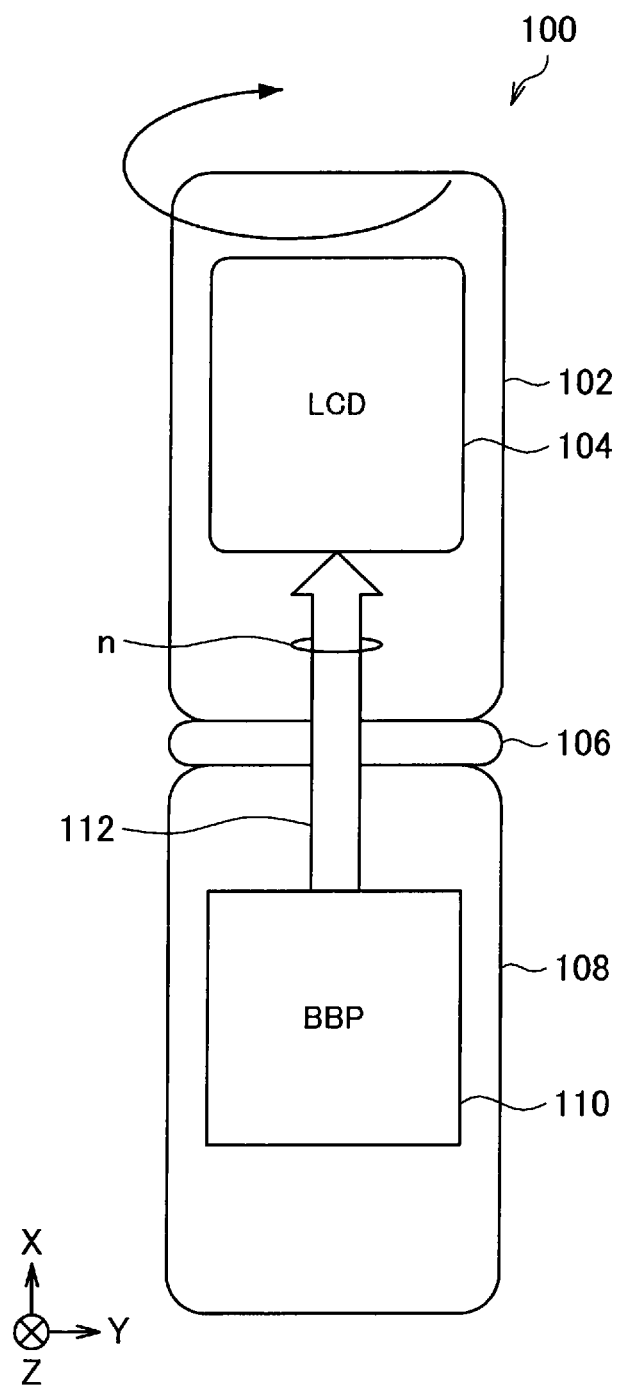
FIG. 1 is a schematic diagram illustrating an exemplary configuration of a portable terminal based on parallel transmitting.

This disclosure will be described in further detail by way of embodiments thereof with reference to the accompanying drawings. It should be noted that, in the present specifications and the drawings attached thereto, component elements having substantially a similar functional configuration are denoted by the same reference numerals and the duplicate description of these component elements is skipped.

[Flow of Description]

The following briefly describes a flow of the description associated with the embodiments of the present disclosure. First, with referring to FIG. 1, an exemplary equipment configuration of a portable terminal 100 based on parallel transmitting will be described briefly. Next, with reference to FIG. 2, an exemplary equipment configuration of a portable terminal 130 based on serial transmitting will be described briefly. This description is supplemented in a data transmission method based on serial transmitting with reference to FIG. 3.

Figure 4:
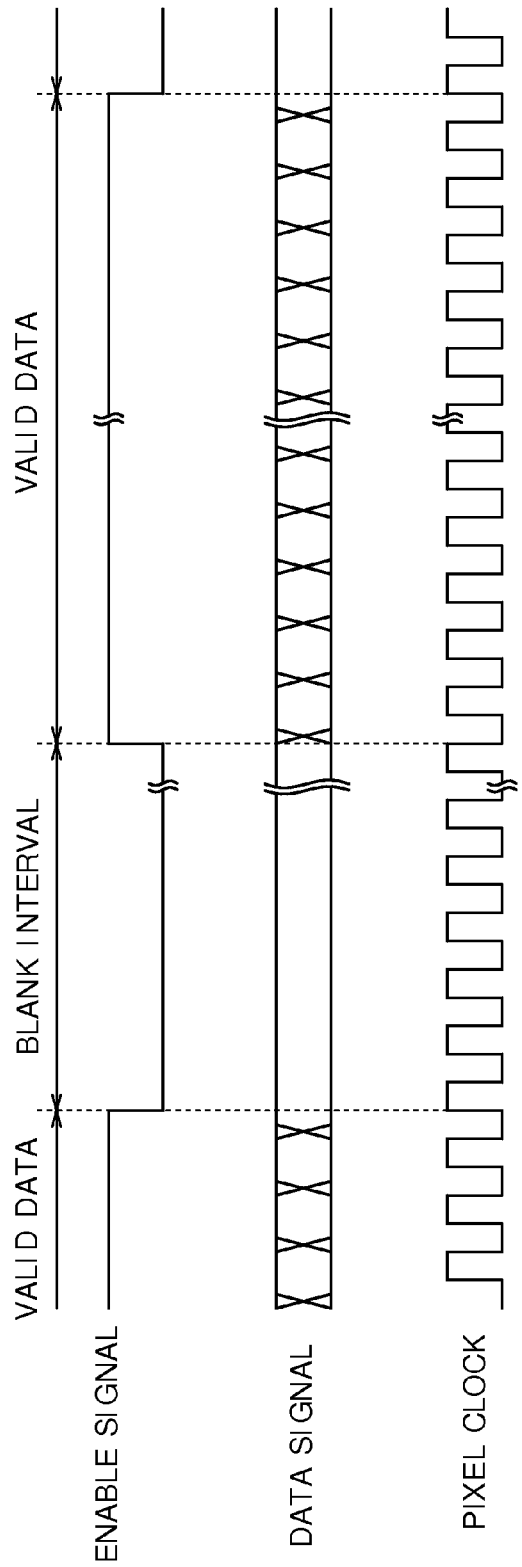
FIG. 4 is a diagram for describing configurations of an enable signal, a data signal, and a pixel clock that are outputted from a deserializer.

Then, with reference to FIG. 4, configurations of an enable signal, a data signal, and a pixel clock that are outputted from a deserializer 170 to be entered in an LCD block 104 are described. Next, with reference to FIG. 5, configurations of a clock to be entered in a serializer 150, a clock for use in serial transmission, and a clock to be outputted from the deserializer 170 are described. Then, with reference to FIG. 6, a data transmission method practiced as one embodiment of the disclosure is described.

Figure 7:
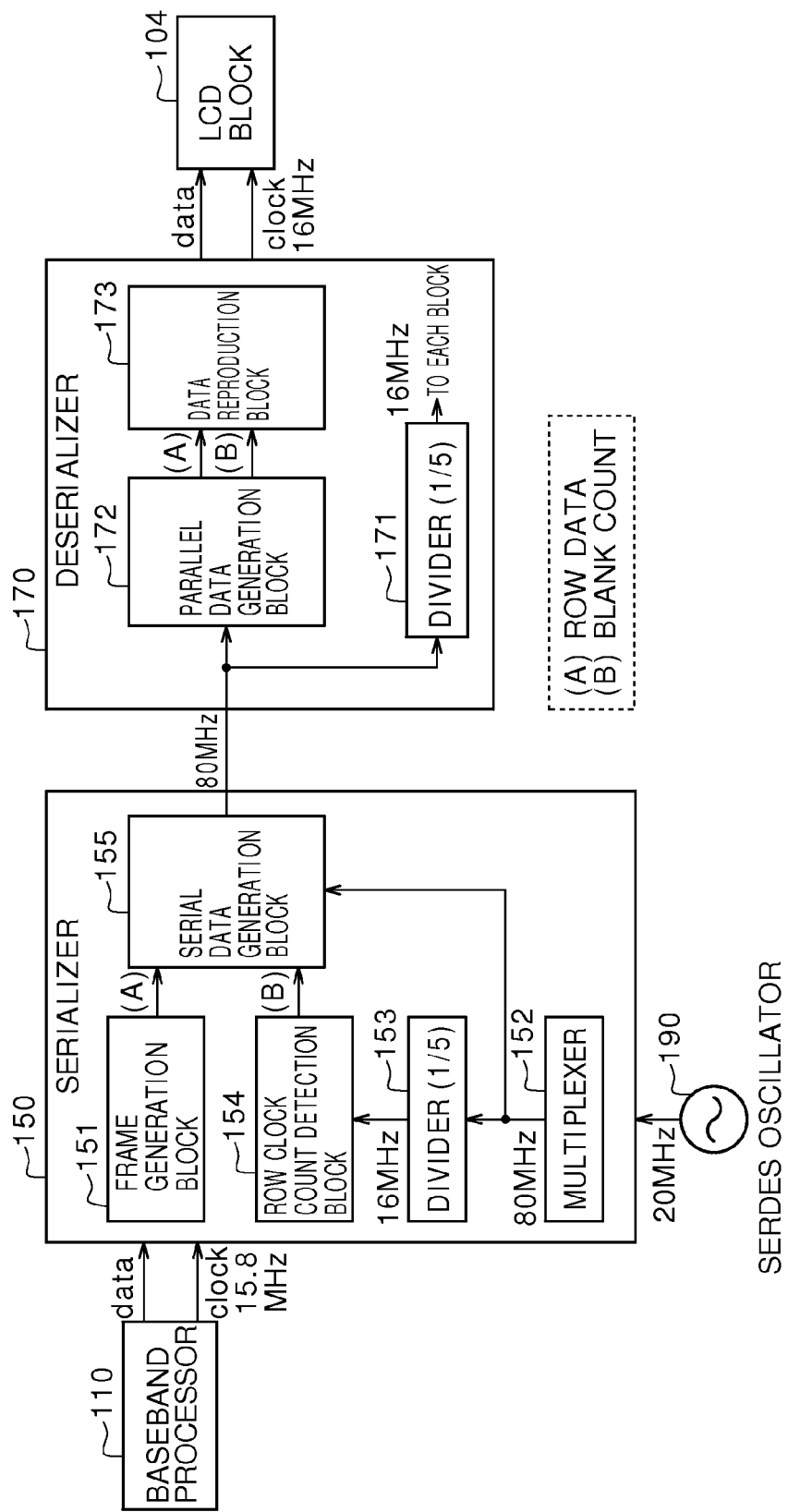
FIG. 7 is a block diagram illustrating exemplary configurations of a serializer and a deserializer practiced as the present embodiment.

Next, with reference to FIG. 7, the exemplary functional configurations of the serializer 150 and the deserializer 170 are described. Then, with reference to FIG. 8, an operation of the serializer 150 practiced as the present embodiment is described. Next, with reference to FIG. 9, an operation of the deserializer 170 practiced as the present embodiment is described. Lastly, the technological concept of the present embodiment is summarized and the effects that are obtained from this technological concept are described briefly.

DESCRIPTION ITEMS (1) Foreword
(1-1) Equipment configuration of the portable terminal 100 based on parallel transmitting
(1-2) Equipment configuration of the portable terminal 130 based on serial transmitting
(2) Embodiments
(2-1) Data transmission method
(2-1-1) Configurations of various signals
(2-1-2) Flows of clock
(2-1-3) Flows of data
(2-2) Functional configurations
(2-2-1) Configuration of the serializer 150

(2-2-2) Configuration of the deserializer 170
(2-3) Operations
(2-3-1) Blank count detection method
(2-3-2) Row data output method
(3) Summary (1) FOREWORD First, parallel transmitting widely used so far as the data transmitting inside devices and serial transmitting to be widely used from now are overviewed by using examples of the portable terminal 100 and the portable terminal 130 based on these transmission schemes.

(1-1) Equipment Configuration of the Portable Terminal 100 Based on Parallel Transmitting First, with reference to FIG. 1, an exemplary equipment configuration of the portable terminal 100 based on parallel transmitting is described briefly. FIG. 1 shows one example of the equipment configuration of the portable terminal 100 based on parallel transmitting. FIG. 1 schematically draws a mobile phone as one example of the portable terminal 100. It should be noted that the application scope of the technology to be described later is not limited to mobile phones; for example, this technology is also applicable to information processing apparatuses such as a note PC and various portable electric devices.

As shown in FIG. 1, the portable terminal 100 is mainly made up of a display block 102, the LCD block 104, a connection block 106, an operator block 108, a baseband processor 110 (BBP), and a parallel signal line path 112. It should be noted that LCD is short for Liquid Crystal Display. The display block 102 may be referred to the display side and the operator block 108 may be referred to as the main side. For the convenience of description, an example is used in which video signals are transmitted over the parallel signal line path 112. Obviously, the types of signals to be transmitted over the parallel signal line path 112 are not limited to video signals; for example, control signals and audio signals are also transmitted over the parallel signal line path 112.

As shown in FIG. 1, the display block 102 has the LCD block 104. First, a video signal transmitted over the parallel signal line path 112 is entered to the LCD block 104. Then, the LCD block 104 displays a video on the basis of the entered video signal. The connection block 106 is a member configured to connect the display block 102 and the operator block 108 together. The connection member forming this connection block 106 has a structure that rotates the display block 102 by 180 degrees within a Z-Y plane. This connection member may be also formed to rotate the display block 102 within an X-Z plane. In this case, the portable terminal 100 has a structure in which the portable terminal 100 can be folded. It should be noted that this connection member may have a structure that makes the display block 102 movable in any directions.

The baseband processor 110 is a computation processing block that provides communication control and an application execution function for the portable terminal 100. A parallel signal outputted from the baseband processor 110 is transmitted to the LCD block 104 of the display block 102 over the parallel signal line path 112. Many signal lines are wired to the parallel signal line path 112. For example, in the case of a mobile phone, the number of signal lines n is approximately 50. The transmission rate of each video signal is approximately 130 Mbps if the resolution of the LCD block 104 is QVGA (Quarter Video Graphics Array). The parallel signal line path 112 is wired so as to pass the connection block 106.

To be more specific, on the connection block 106, many signal lines forming the parallel signal line path 112 are wired. If the movable range of the connection block 106 is widened as described above, the enlarged movement of the connection block 106 may increase a risk of damaging the parallel signal line path 112. As a result, the reliability of the parallel signal line path 112 is damaged. On the other hand, in order to maintain the reliability of the parallel signal line path 112, the movable range of the connection block 106 is limited, thereby reducing the designability and functionality of the portable terminal 100. For these reasons, a mechanism for enhancing the degree of freedom of the movable member forming the portable terminal 100 and the reliability of parallel signal line path 112 has been required. One answer to this requirement is the employment of serial transmitting to be described later.

Thus, the equipment configuration of the portable terminal 100 based on parallel transmitting has been described.

Figure 2:
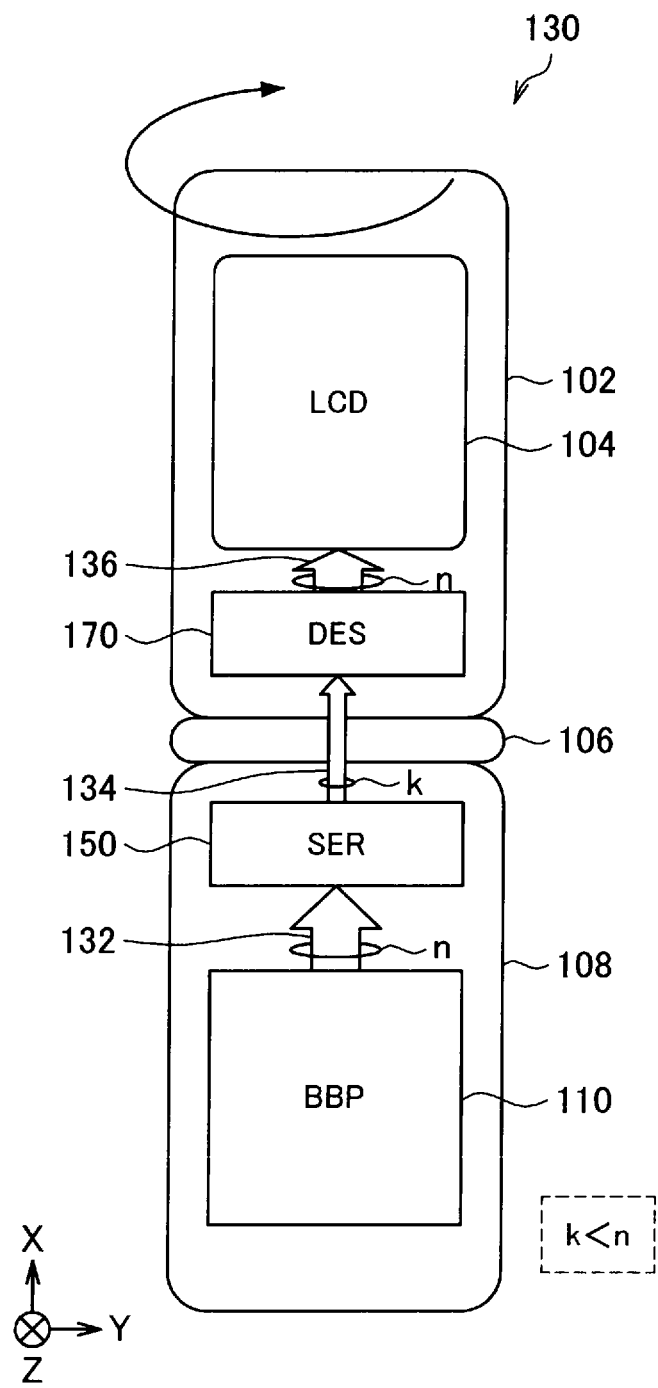
FIG. 2 is a schematic diagram illustrating an exemplary configuration of a portable terminal based on serial transmitting.

(1-2) Equipment Configuration of the Portable Terminal 130 Based on Serial Transmitting The following briefly describes an exemplary equipment configuration of the portable terminal 130 based on serial transmitting with reference to FIG. 2. FIG. 2 shows one example of the equipment configuration of the portable terminal 130 based on serial transmitting.

It should be noted that FIG. 2 schematically draws a mobile phone as one example of the portable terminal 130. The application scope of the technology to be described later is not limited to mobile phones. For example, this technology is also applicable to information processing apparatuses such as a note PC and various portable electronic devices. The component elements substantially similar to those of the portable terminal 100 based on parallel transmitting are denoted by the same reference numerals and the detail description thereof is skipped.

As shown in FIG. 2, the portable terminal 130 is mainly made up of a display block 102, an LCD block 104, a connection block 106, and an operator block 108. In addition, the portable terminal 130 has a baseband processor 110 (BBP), a parallel signal line paths 132 and 136, a serial signal line path 134, a serializer 150, and a deserializer 170.

Unlike the portable terminal 100, the portable terminal 130 transmits a video signal by serial transmitting over the serial signal line path 134 wired to the connection block 106. Hence, the operator block 108 has the serializer 150 configured to serialize a parallel signal outputted from the baseband processor 110. On the other hand, display block 102 has the deserializer 170 configured to deserialize a serial signal transmitted over the serial signal line path 134.

Figure 3:
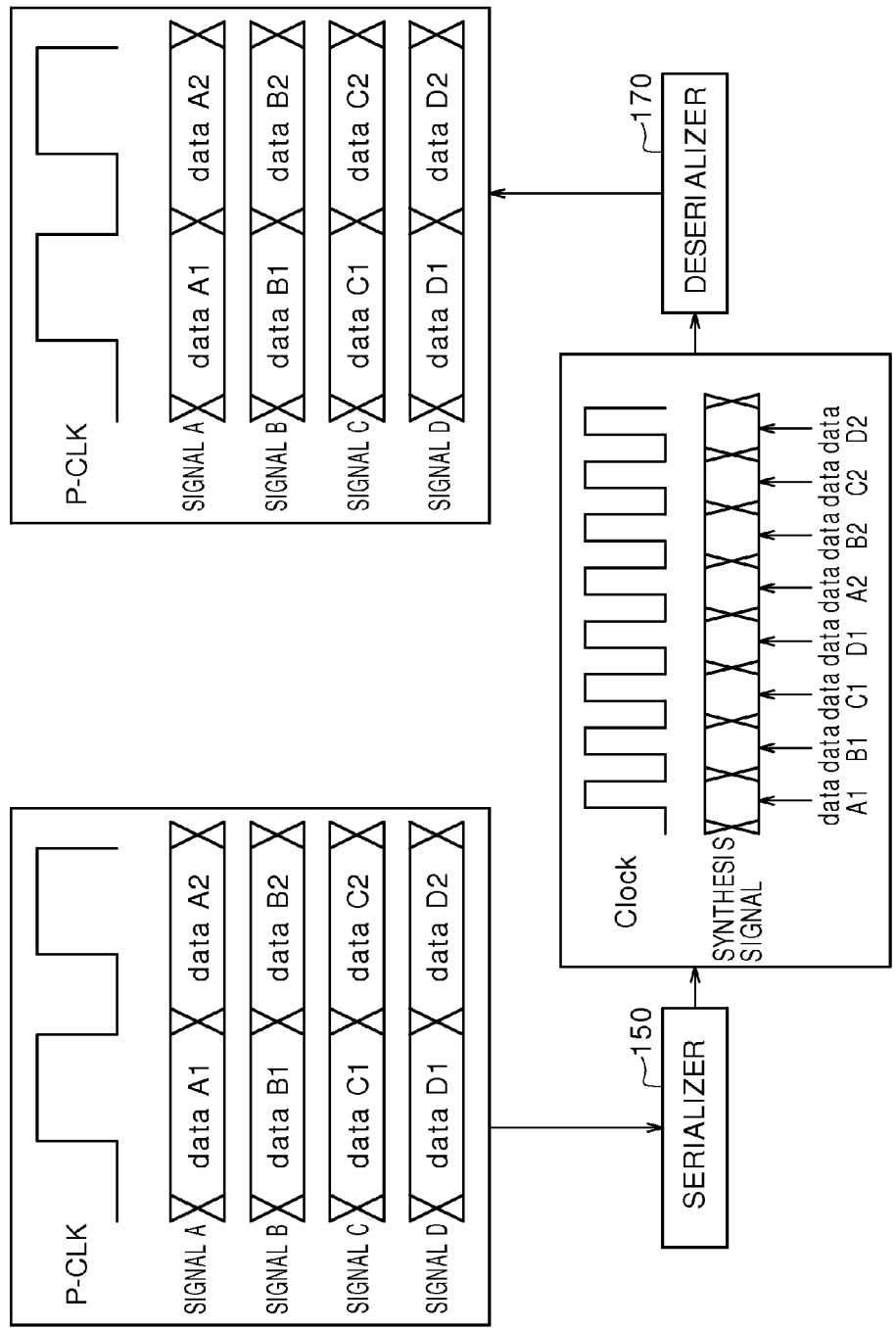
FIG. 3 is a diagram illustrating one example of data transmission method associated with serial data transmitting.

The serializer 150 converts a parallel signal outputted from the baseband processor 110 and entered over the parallel signal line path 132 into a serial signal. For example, as shown in FIG. 3, signal A, signal B, signal C, and signal D are entered in the serializer 150 in parallel to each other in synchronization with a parallel signal clock (P-CLK).

It should be noted however that signal A includes data A1 and data A2, signal B includes data B1 and data B2, signal C includes data C1 and data C2, and signal D includes data D1 and data D2.

The serializer 150 synthesizes, in series, data A1 and A2, data B1 and B2, data C1 and C2, and data D1 and D2 included in signal A, Signal B, signal C, and signal D, respectively, thereby generating a synthesis signal synchronized with a serial signal clock having a frequency four times as high as that of the parallel signal. This synthesis signal is the serial signal. The serial signal obtained by the serializer 150 is entered in the deserializer 170 over the serial signal line path 134.

Receiving the serial signal, the deserializer 170 separates each item of data from the received serial signal to restore the parallel signal. Next, the deserializer 170 enters the restored parallel signal into the LCD block 104 over the parallel signal line path 136. It should be noted that the serial signal line path 134 may transmit the clock along with the serial signal (or the data signal) obtained by synthesizing signal A, signal B, signal C, and signal D. The serial signal may also be transmitted by a transmitting scheme based on a differential signal, such as LVDS (Low Voltage Differential Signal) for example.

The employment of serial transmitting as described above allows the number of wires k of the serial signal line path 134 to be largely smaller than the number of wires n of the parallel signal line path 112 of the portable terminal 100 shown in FIG. 1 (1≤k<<n). For example, the number of wires k can be reduced to several at most. As a result, the degree of freedom associated with the movable range of the connection block 106 to which the parallel signal line path 112 is wired can be greatly enlarged as compared with the connection block 106 to which the parallel signal line path 112 is wired. At the same time, the reliability of the serial signal line path 134 also is enhanced.

Thus, the equipment configuration of the portable terminal 130 based on serial transmission has been described.

(2) EMBODIMENTS

The following describes one embodiment of the present disclosure. This embodiment is related with a technology of minimize the influence of an error caused between a clock used in outputting data from the baseband processor 110 and a clock used in entering data into the LCD block 104 onto the reproduction of the data.

(2-1) Data Transmission Method

The following describes configurations of signals to be entered in the LCD block 104, configurations of clocks that flow over a route from the baseband processor 110 to the LCD block 104, and configurations of data.

(2-1-1) Configurations of Various Signals

As shown in FIG. 4, an enable signal, a data signal, and a pixel clock are entered in the LCD block 104. This pixel clock provides a reference clock that is normally entered in the LCD block 104. The data signal is entered in the LCD block 104 in synchronization with this pixel clock. It should be noted that this data signal is entered in the LCD block 104 only when the enable signal is an interval (hereafter referred to as a valid data interval) in an active state (or a high level state in the example shown in FIG. 4). Namely, the data signal is not entered in the LCD block 104 when the enable signal is in an interval (hereafter referred to as a blank interval) of an inactive state (or a low level state in the example shown in FIG. 4).

Normally, image data for one row is entered in one interval (or one valid data interval) when the enable signal is continuously in an active state. When two or more valid data intervals are repeated, image data for one screen is entered in the LCD block 104. An enable signal, a data signal, and a pixel clock are normally entered in the serializer 150. The serializer 150 serializes the data signal corresponding to a valid data interval and transmits the serialized data signal to the deserializer 170. On the basis of the data signal received from the serializer 150, the deserializer 170 generates a pixel clock and an enable signal and outputs the data signal in synchronization with a valid data interval.

As described above, an enable signal, a data signal, and a pixel clock are entered in the LCD block 104. These enable signal, data signal, and pixel clock are outputted from the baseband processor 110 and serial-transmitted by the serializer 150 to be entered from the deserializer 170 into the LCD block 104.

(2-1-2) Flows of Clock

Figure 5:
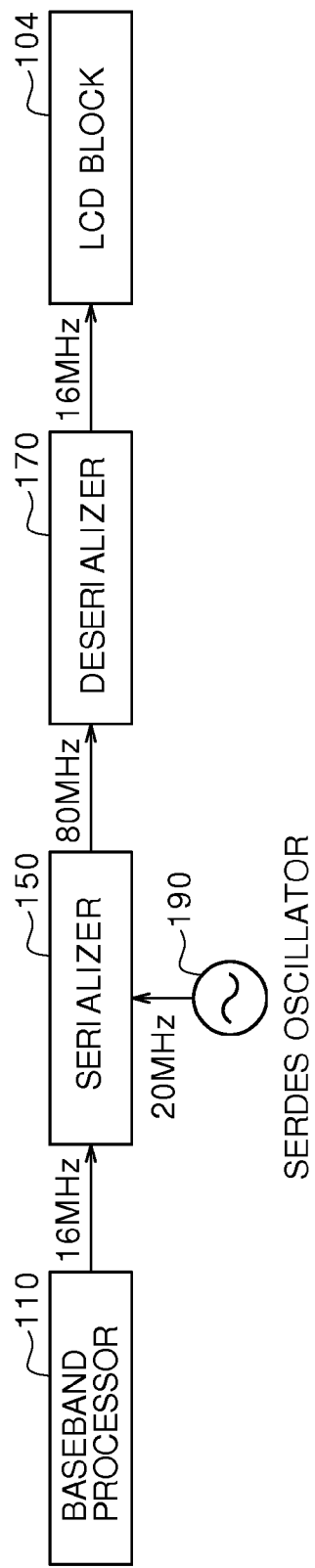
FIG. 5 is a diagram for describing configurations of a clock to be entered in the a serializer, a clock for use in serial transmission, and a clock to be outputted from a deserializer.

The following describes a relation between a clock for use in outputting data signal and a clock for use in the serial transmission of data with reference to FIG. 5. For example, assume that four data signals be outputted from the baseband processor 110 in synchronization with a pixel clock of 16 MHz. Namely, assume that the four data signals be entered in the serializer 150 at a rate of 16 MHz×4 bits=64 Mbps.

Also assume that a clock of 20 MHz be entered from an oscillator 190 into the serializer 150 as shown in FIG. 5. In this case, the serializer 150 receives the data signals with the clock of 20 MHz entered from the oscillator 190. At the same time, the serializer 150 multiplies the frequency of the clock of 20 MHz entered from the oscillator 190 by four, thereby generating a clock of 80 MHz. Then, the serializer 150 serial-transmits the data signals by use of the generated clock of 80 MHz. On the other hand, the deserializer 170 divides the clock of 80 MHz by five to generate a clock of 16 MHz. In addition, the deserializer 170 enters the data signals to the LCD block 104 in synchronization with the generated clock of 16 MHz.

As described above, the clock for use in serial transmission is generated by multiplying the clock generated by the oscillator 190. The clock for use in entering data signals into the LCD block 104 is generated by dividing the clock for use in serial transmission. At this time, it is required for the clock for use in entering data signals into the LCD block 104 to be equal to the clock used in outputting data signals from the baseband processor 110. In the example shown in FIG. 5, both the clocks match each other in 16 MHz.

(2-1-3) Flows of Data

Figure 6:
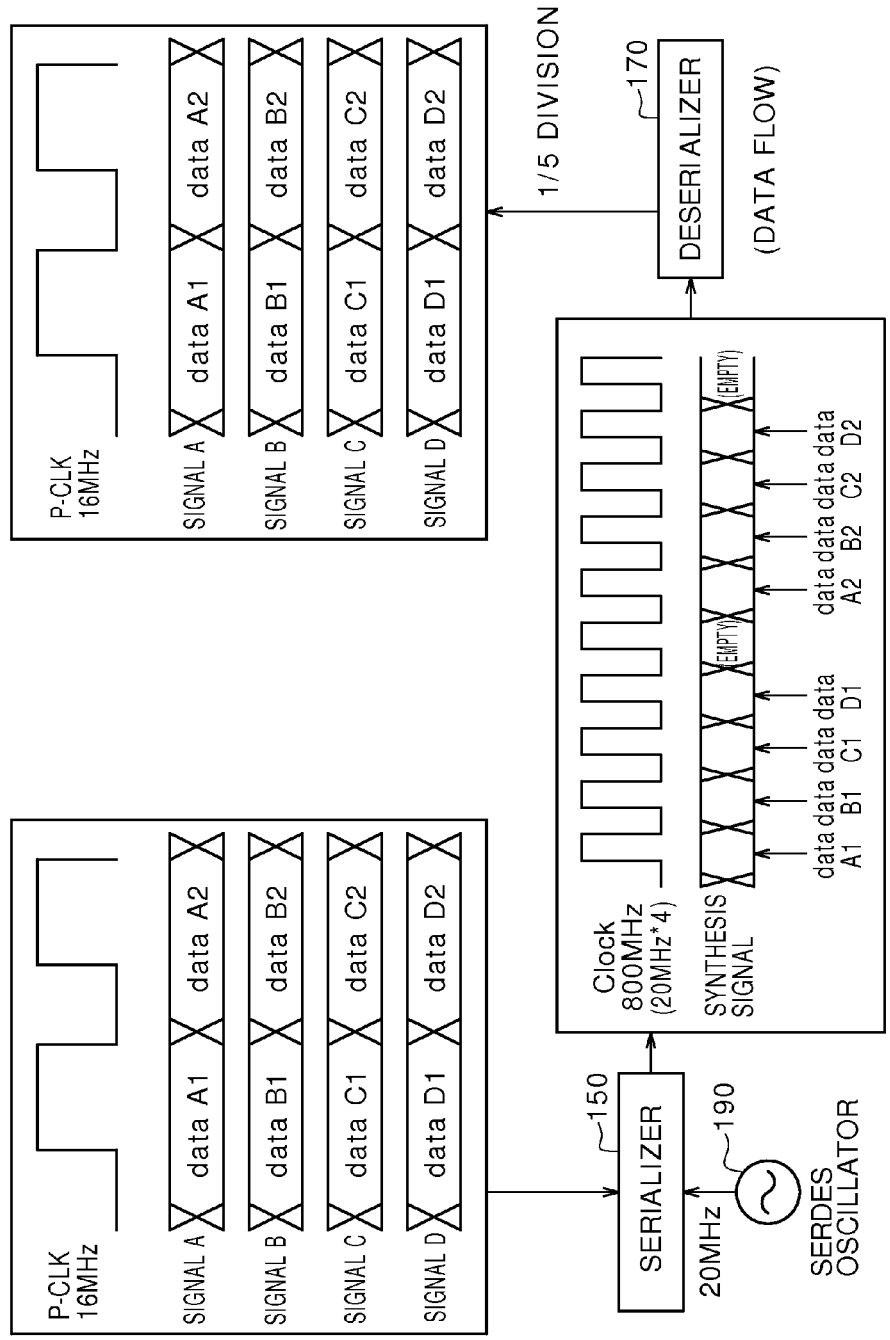
FIG. 6 is a diagram illustrating an exemplary data transmission method practiced as one embodiment of the disclosure.

The following describes the method of transmitting data signals by the serializer 150 and the deserializer 170 in more detail with reference to FIG. 6.

As shown in FIG. 6, data signals are entered in the serializer 150 in synchronization with the pixel clock of 16 MHz. At this time, four data signals (signal A, signal B, signal C, and signal D) are entered in the serializer 150 in parallel to each other. When the four signals are entered, the serializer 150 serial-transmits the data signals in synchronization with the clock of 80 MHz generated by multiplying, by four, the clock of 20 MHz entered from the oscillator 190. At this time, as shown in FIG. 6, one clock out of five clocks becomes an empty area. On the other hand, the deserializer 170 divides the clock of 80 MHz by five and outputs the four data signals in parallel to each other in synchronization with a resultant clock of 16 MHz.

In example shown in FIG. 6, the frequency of the clock for use in entering data signals into the serializer 150 is 16 MHz and the frequency of the clock entered from the oscillator 190 is 20 MHz, so that 16 MHz×5=20 MHz×4=80 MHz, thereby correctly transmitting the data. It should be noted however that this relation is established when the frequency of the clock for use in entering data signals into the serializer 150 correctly matches 16 MHz and the frequency of the clock entered from the oscillator 190 into the serializer 150 correctly matches 20 MHz as a premise.

However, an oscillator that can output a clock having a frequency correctly matching a predetermined frequency is costly. Therefore, normally, an oscillator that outputs a clock having a frequency near a predetermined frequency is used.

Using such an oscillator a clock of 16.1 MHz or 15.9 MHz is actually outputted where a clock of 16 MHz should be outputted. Likewise, a clock of 20.1 MHz or a clock of 19.9 MHz is actually outputted where a clock of 20 MHz should be outputted, for example.

For example, if a clock of 20 MHz is entered from the oscillator 190 into the serializer 150 and a clock of 16.1 MHz is entered from the baseband processor 110 into the serializer 150, then the clock (having 16.1 MHz) entered from the baseband processor 110 into the serializer 150 exceeds a clock (having 16 MHz) entered from the deserializer 170 into the LCD block 104 (this is known as an overflow). If this happens, the input gets faster than the output, thereby causing a drop of input data.

Conversely, if a clock of 20 MHz is entered from the oscillator 190 into the serializer 150 and a clock of 15.9 MHz is entered from the baseband processor 110 into the serializer 150, then the clock (having 15.9 MHz) entered from the baseband processor 110 into the serializer 150 goes below a clock (having 16 MHz) entered from the deserializer 170 into the LCD block 104 (this is known as an underflow). If this happens, the input gets slower than the output, thereby causing an interval having no output data.

The present embodiment is related to a technology that suppresses the occurrence of data drop or an interval having no output data even if such an overflow or an underflow occurs. It should be noted that the case where an overflow occurs can be converted into the case an underflow occurs by adjusting multiplication or division numbers. In the above-mentioned example, the multiplication number is 4 and the division number is 5. If the multiplication number is set to 5 and the division number is set to 6, then the clock entered from the deserializer 170 into the LCD block 104 is 20 MHz× ⅚=16.67 MHz. If these multiplication number and division number are set, an underflow case is provided even if the frequency of the clock entered from the baseband processor 110 into the serializer 150 is 16.1 MHz.

(2-2) Functional Configurations

The following describes functional configurations of the serializer 150 and the deserializer 170 practiced as the present embodiment with reference to FIG. 7. FIG. 7 is a block diagram illustrating the functional configurations of the serializer 150 and the deserializer 170 practice as the present embodiment.

(2-2-1) Configuration of the Serializer 150

First, a functional configuration of the serializer 150 is described.

It is assumed here that data signals and a clock of 15.8 MHz (hereafter referred to as an input clock) be entered from the baseband processor 110 into to serializer 150. These data signals and input clock are entered with timings shown in FIG. 4. It is also assumed that a clock of 20 MHz (hereafter referred to as a reference clock) be entered from the oscillator 190 into the serializer 150. Further, it is assumed that a clock of 80 MHz (hereafter referred to as a transmission clock) be used for the serial transmission from the serializer 150 to the deserializer 170.

As shown in FIG. 7, the serializer 150 is mainly made up of a frame generation block 151, a multiplier 152, a divider 153, a row clock count detection block 154, and a serial data generation block 155. It should be noted that each of these component elements operates on the reference clock.

When data signals for one row are entered from the baseband processor 110 to the serializer 150, the frame generation block 151 buffers the entered data signals for one row. The multiplier 152 multiplies the reference clock entered from the oscillator 190 by four to generate a transmission clock of 80 MHz. This transmission clock is entered in the divider 153 and the serial data generation block 155. The divider 153 entered with the transmission clock divides the entered the transmission clock by five to generate a clock of 16 MHz (hereafter referred to as a first output clock). This first output clock is entered in the row clock count detection block 154.

When the first output clock is entered, the row clock count detection block 154 measures a length of a valid data interval of the data signals for one row and a length of a blank interval following this valid data interval by the number of clocks of this first output block. To be more specific, the row clock count detection block 154 counts the number of clocks of the first output clock corresponding to an interval including the continuous valid data interval and blank interval. In what follows, the counted number of clocks is referred to as a row clock count. After counting the row clock count, the row clock count detection block 154 subtracts the number of data items for one row from the row clock count to compute the clock count (hereafter referred to as a blank count, namely the number of blanks) corresponding to the blank interval.

The blank count computed by the row clock count detection block 154 is entered in the serial data generation block 155. When the blank count is entered, the serial data generation block 155 serializes the data signals for one row buffered so far and the entered blank count to generate a serial transmission signal. Next, the serial data generation block 155 transmits the generated serial transmission signal to the deserializer 170 in synchronization with the transmission clock of 80 MHz.

Thus, a functional configuration of the serializer 150 has been described.

(2-2-2) Configuration of the Deserializer 170

The following describes a functional configuration of the deserializer 170.

As shown in FIG. 7, the deserializer 170 is mainly made up of a divider 171, a parallel data generation block 172, and a data reproduction block 173.

When a serial transmission signal is entered from the serializer 150, the divider 171 divides the entered serial transmission signal by five to generates a clock of 16 MHz (hereafter referred to as a second output clock). This second output clock is entered into each component element of the deserializer 170. At the same time, the parallel data generation block 172 makes parallel the serial transmission signal to separate the blank count from the data signals for one row. The data signals for one row and the blank count are entered in the data reproduction block 173. When the data signals for one row and the blank count are entered, the data reproduction block 173 enters the second output clock of 16 MHz and the data signals for one row into the LCD block 104 with timings shown in FIG. 4.

Thus, a functional configuration of the deserializer 170 has been described.

(2-3) Operations

Figure 8:
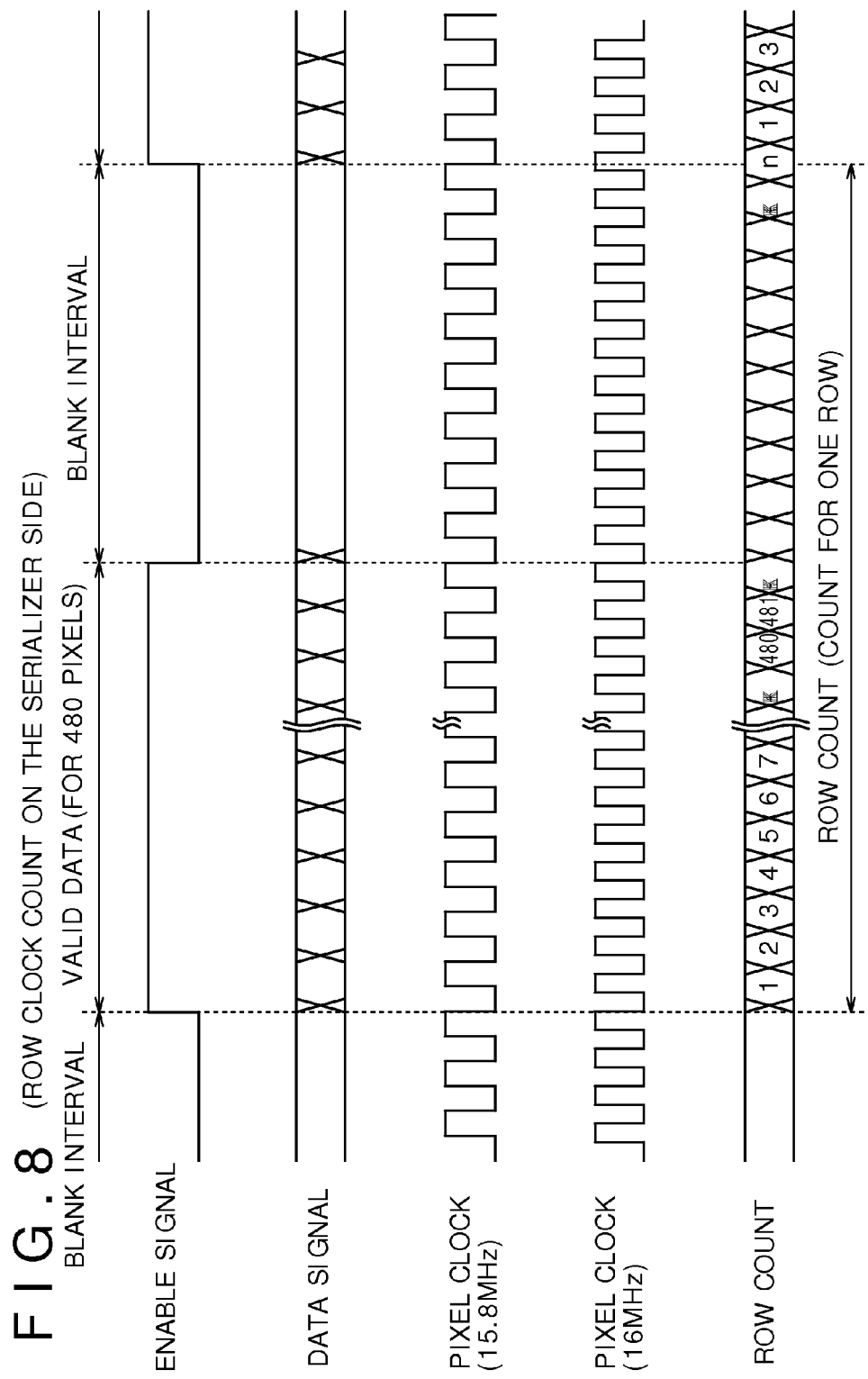
FIG. 8 is a diagram for describing an operation of the serializer practiced as the present embodiment.
Figure 9:
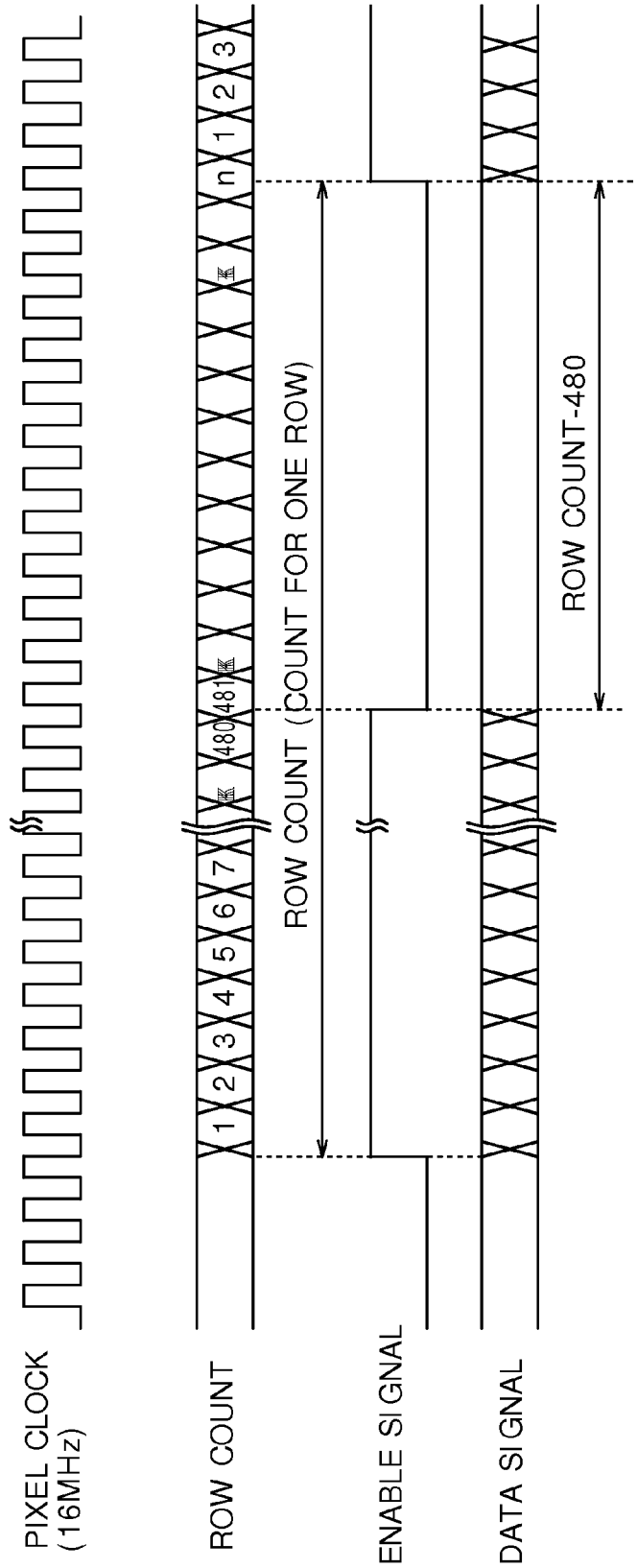
FIG. 9 is a diagram for describing an operation of the deserializer practiced as the present embodiment.

The following describes, in more detail, the operations of the serializer 150 and the deserializer 170 with reference to FIG. 8 and FIG. 9.

(2-3-1) Blank Count Detection Method

First, operations of the serializer 150 are described. The operation characteristic to the serializer 150 practiced as the present embodiment lies in a method of detecting blank count corresponding to a blank interval. Therefore, the following describes an operation of the serializer 150 with attention paid to the blank count detection method. In the description, it is assumed that a data amount per pixel be 24 bits and one row be 480 pixels.

As shown in FIG. 8, it is assumed that data signals be entered in the serializer 150 in synchronization with an input clock of 15.8 MHz. In addition, an enable signal indicative of a valid data interval and blank interval is entered in the serializer 150. In this example, one row is 480 pixels wide, so that the length of a valid data interval is equivalent to 480 clocks. On the other hand, the second output clock generated from a transmission clock by the deserializer 170 is 16 MHz. Therefore, if data signals for 480 clocks are outputted on this second output clock, the data signal in the neighborhood of a valid data interval is not outputted.

In order to solve this problem, the length of a blank interval with the second output block being reference is measured by use of the first output clock have the same frequency (16 MHz) as that of the second output clock. First, on the basis of the function of the row clock count detection block 154, the serializer 150 measures an interval length from the origin of a valid data interval to the end of the blank interval following this valid data interval by use of the clock count of the first output clock. Next, on the basis of the function of the row clock count detection block 154, the serializer 150 computes the blank count by subtracting 480 (the number of pixels for one row) from the measured clock count (n in the example shown in FIG. 8).

(2-3-2) Row Data Output Method

The following describes an operation of the deserializer 170. The operation characteristic to the deserializer 170 practiced as the present embodiment lies in a method of adjusting the output of a blank interval such that an error between the input clock and the second output clock is absorbed. The following describes the operation of the deserializer 170 with attention paid to the method of outputting row data including the adjustment of a blank interval described above.

As shown in FIG. 9, on the basis of the function of the data reproduction block 173, the deserializer 170 outputs pixel information (data signals) from clock 1 to clock 480 with the second output clock (the clock of 16 MHz) being reference. In addition, on the basis of the function of the data reproduction block 173, the deserializer 170 outputs blanks equivalent to (n (the number of row counts)−480) clocks (for the number of blanks). Thus, adjusting the blank count in the deserializer 170 allows the suppression of the influence due to the occurrence of an underflow. It should be noted that, as seen from FIG. 9, this adjustment is equivalent to the adjustment of the valid data interval and blank interval in an enable signal.

(3) SUMMARY

Lastly, the following briefly summarizes the contents of the technology practiced as the present embodiment of the disclosure. The technological contents as described herein are applicable to the in-equipment data transmission in various kinds of information processing apparatuses, such as PC, mobile phone, portable game machine, portable information terminal, information household appliances, and car navigation system, for example. The technological contents as described herein are applicable to signal processing apparatuses for use in in-equipment data transmission, for example.

The above-mentioned signal processing apparatus may have an input block, a count block, an enable signal control block, an enable signal output block, and a data output block that are described below. To be more specific, the above-mentioned input block receives the predetermined number of items of data and a first enable signal synchronized with a first clock and taking an active state in an interval where the above-mentioned data is valid. The above-mentioned count block counts the number of clocks of an interval where the above-mentioned first enable signal is inactive with a second clock faster than the above-mentioned first clock being reference.

The above-mentioned enable signal control block puts a second enable signal into an active state for the number of clocks equivalent to the above-mentioned predetermined number with the above-mentioned second clock being reference and puts the above-mentioned second enable signal into an inactive state for the number of clocks counted by the above-mentioned count block. Further, the above-mentioned signal output block outputs the above-mentioned second enable signal. The above-mentioned data output block outputs the above-mentioned predetermined number of items of data in synchronization with the above-mentioned second clock in an interval where the above-mentioned second enable signal takes an active state.

If the clock (the first clock) for use in data input and the clock (the second clock) for use in output are different form each other, an interval in which valid data is inputted will differ from the interval in which data is outputted. For example, if the first clock is slower than the second clock, the input of data does not follow the output of data, thereby causing data drop. In order to prevent such a data drop from happening, the output timing of data must be adjusted. Thus, the above-mentioned adjusting method adjusts an interval where no data is outputted (namely, an interval where an enable signal is inactive).

The length of an interval where there is valid data can be expressed by the number of clocks for the number of items of data. On the other hand, it is desirable for the length of an interval where there is not valid data to be measured by actually using the second clock. By actually measuring the length of this interval and adjusting the second enable signal by use of a result of the measurement, an error between the first clock and the second clock can be adaptively absorbed by following the variation if any of this error.

It should be noted that the above-mentioned novel configuration can be realized by a comparatively simple circuit configuration. In addition, because the above-mentioned novel configuration does not require the use of an oscillator of high precision, the manufacturing cost can be saved accordingly. In addition, because the above-mentioned novel configuration does not require a configuration for executing the precision adjustment of the first clock and the second clock, the design cost can be saved accordingly.

REMARKS

The above-mentioned row clock count detection block 154 is one example of a count block. The above-mentioned data reproduction block 173 is one example of an enable signal control block, an enable signal output block, and a data output block. The above-mentioned multiplier 152 and the divider 153 are examples of a clock conversion block. The above-mentioned operator block 108 is one example of a first signal processing module. The above-mentioned display block 102 is one example of a second signal processing module. The above-mentioned serializer 150 (the serial data generation block 155) is one example of a transmission block. The above-mentioned deserializer 170 (the parallel data generation block 172) is one example of a reception block. The above-mentioned multiplier 152 is one example of a serial transmission clock generation block. The above-mentioned baseband processor 110 is one example of a computation processing block. The above-mentioned LCD block 104 is one example of a display block.

While preferred embodiments of the present disclosure have been described using specific terms, such description is for illustrative purpose, and it is to be understood that changes and variations may be made without departing from the spirit or scope of the following claims.

For example, in the description made above, a configuration in which the number of blanks (a blank count) is serial-transmitted as it is; however, it is also practicable to serial-transmit a difference between a predetermined fixed value and the blank count. Further, it is practicable to serial-transmit a difference between a blank count obtained by the input clock and a blank count obtained by the first output clock. These configurations can reduce the amount of information to be transmitted, thereby increasing the transmission efficiency.

The present application contains subject matter related to that disclosed in Japanese Priority Patent Application JP 2010-286316 filed in the Japan Patent Office on Dec. 22, 2010, the entire content of which is hereby incorporated by reference.

What is claimed is:

1. A signal processing apparatus comprising:
   an input block configured to receive a predetermined number of items of data and a first enable signal, wherein the first enable signal has an active state in an interval where data is valid in synchronization with a first clock;
   a count block configured to count, with a second clock faster than said first clock being a reference, a number of clock signals in an interval where said first enable signal is inactive;
   an enable signal control block configured to set a second enable signal to an active state for a predetermined number of clock signals of said second clock, and set said second enable signal to an inactive state for said number of clock signals counted by said count block;
   an enable signal output block configured to output said second enable signal; and
   a data output block configured to output said predetermined number of items of data in synchronization with said second clock in an interval where said second enable signal is active.

2. The signal processing apparatus according to claim 1, further comprising: a clock conversion block configured to frequency-convert a reference clock having a predetermined frequency to generate said second clock, wherein said clock conversion block generates said second clock by use of a conversion rule such that said second clock becomes faster than said first clock.

3. The signal processing apparatus according to claim 1, wherein said signal processing apparatus comprises:
   a first signal processing module; and
   a second signal processing module connected to said first signal processing module via a predetermined signal line;
   said first signal processing module comprising:
      said input block,
      said count block, and
      a transmission block configured to serialize said data and said number of clock signals counted by said count block and transmit said serialized data and said serialized number of clock signals to said second signal processing module, and
   said second signal processing module comprising:
      a reception block configured to receive said serialized data and said serialized number of clock signals from said transmission block of said first signal processing module and make parallel said received serialized data and said serialized number of clock signals,
      said enable signal control block,
      said data output block, and
      said enable signal output block.

4. The signal processing apparatus according to claim 3, wherein, said transmission block transmits a difference between a number of clock signals of said interval where said first enable signal is inactive with said first clock used as reference and a number of clock signals of said interval where said first enable signal is inactive with said second clock used as reference.

5. The signal processing apparatus according to claim 3, wherein, said transmission block transmits a difference between a predetermined value and a number of clock signals of said interval where said first enable signal is inactive with said second clock used as reference.

6. The signal processing apparatus according to claim 3, wherein said first signal processing module comprises a serial transmission clock generation block configured to multiply a predetermined reference clock to generate a serial transmission clock for transmitting and receiving said data and said number of clock signals, and a first divider configured to divide said serial transmission clock to generate said second clock, and said second signal processing module comprises a second divider configured to divide said serial transmission clock to generate said second clock.

7. The signal processing apparatus according to claim 1, wherein said count block counts a number of clock signals of an interval obtained by combining an interval where said first enable signal is active and another interval following said interval where said first enable signal is inactive, thereby using a value obtained by subtracting a predetermined value from said number of clock signals as said number of clocks of said interval where said first enable signal is inactive.

8. The signal processing apparatus according to claim 1, further comprising:
   a computation processing block configured to output data entered in said input block; and
   a display block configured to receive said predetermined number of items of data output from said data output block, and said second enable signal output from said enable signal output block.

9. A signal processing method comprising:
   receiving a predetermined number of items of data and a first enable signal, wherein the first enable signal has an active state in an interval where data is valid in synchronization with a first clock;
   counting, with a second clock faster than said first clock being a reference, a number of clock signals in an interval where said first enable signal is inactive;
   putting setting a second enable signal to an active state for a predetermined number of clock signals of said second clock, and setting said second enable signal to an inactive state for said counted number of clock signals;
   outputting said second enable signal; and
   outputting said predetermined number of items of data in synchronization with said second clock in an interval where said second enable signal is active.

10. A signal processing apparatus comprising:
    an input block configured to receive a predetermined number of items of data and a first enable signal having an active state in an interval where data is valid in synchronization with a first clock;

a count block configured to count, with a second clock faster than said first clock being reference, a number of clocks in an interval where said first enable signal is inactive;

an enable signal control block configured to put a second enable signal in an active state for a number of clocks equal to a predetermined number with said second clock being reference, and put said second enable signal in an inactive state for the number of clocks counted by said count block;

an enable signal output block configured to output said second enable signal;

a data output block configured to output said predetermined number of items of data in synchronization with said second clock in an interval where said second enable signal is active, wherein said count block counts a number of clocks of an interval obtained by combining an interval where said first enable signal is active and another interval following said interval where said first enable signal is inactive, thereby using a value obtained by subtracting a predetermined value from said number of clocks as said number of clocks of said interval where said first enable signal is inactive.

* * * * *